(12) United States Patent
Schubert

(10) Patent No.: US 8,008,965 B2
(45) Date of Patent: Aug. 30, 2011

(54) DEVICE FOR SUPPLYING POWER TO AN INTERGRATED CIRCUIT

(75) Inventor: Goeran Schubert, Nuremberg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 1047 days.

(21) Appl. No.: 11/884,648

(22) PCT Filed: Mar. 10, 2005

(86) PCT No.: PCT/DE2005/000433
§ 371 (c)(1),
(2), (4) Date: Aug. 17, 2007

(87) PCT Pub. No.: WO2006/094469
PCT Pub. Date: Sep. 14, 2006

(65) Prior Publication Data
US 2008/0197820 A1    Aug. 21, 2008

(51) Int. Cl.
G05F 3/02 (2006.01)
G05F 1/46 (2006.01)
(52) U.S. Cl. ........................ 327/538; 323/233
(58) Field of Classification Search .................. None
See application file for complete search history.

(56) References Cited

U.S. PATENT DOCUMENTS

| | | |
|---|---|---|
| 4,551,668 A | 11/1985 | Kammiller |
| 5,616,952 A | 4/1997 | Nakano et al. |
| 5,874,827 A | 2/1999 | Hashimoto |
| 6,252,384 B1 | 6/2001 | Arai et al. |
| 6,580,597 B2 | 6/2003 | Kanouda et al. |
| 6,963,110 B2 | 11/2005 | Woo et al. |
| 7,061,142 B1 | 6/2006 | Marshall |
| 2004/0217442 A1 | 11/2004 | Miyagi |
| 2005/0030092 A1 | 2/2005 | Greitschus et al. |
| 2006/0148306 A1 | 7/2006 | Desinger et al. |
| 2009/0322415 A1* | 12/2009 | Schubert et al. ............ 327/538 |

FOREIGN PATENT DOCUMENTS

| | | |
|---|---|---|
| DE | 197 46 113 | 4/1998 |
| WO | WO 03/012870 | 2/2003 |

OTHER PUBLICATIONS

Office Action in U.S. Appl. No. 12/310,854, mailed Feb. 10, 2011, (14 pages).

* cited by examiner

Primary Examiner — Lincoln Donovan
Assistant Examiner — Terry L Englund
(74) Attorney, Agent, or Firm — W. F. Fasse; W. G. Fasse

(57) ABSTRACT

The device (12) is used for supplying power to a rapid clocking and/or a rapidly clocked integrated circuit (13), which has a circuit load (17) to be supplied with power and an internal capacity (15) connected parallel to the circuit load (17). The integrated circuit (13) has a high clocking frequency (f1) which is in particular at least in the MHz range. A supply unit (14) which is in particular designed as a current source is directly connected to the internal capacity (15). The supply unit (14) has an internal resistance, the impedance value of which is so high at the clocking frequency (f1) that a current ($I_{D2}$) which supplies the circuit load (17) originates to a greater degree from the internal capacity (15) than from the supply unit (14).

6 Claims, 4 Drawing Sheets

DEVICE FOR SUPPLYING POWER TO AN INTERGRATED CIRCUIT

FIELD OF THE INVENTION

The invention relates to a device for supplying power to a rapid clocking and/or rapidly clocked integrated circuit, which comprises a circuit load and an internal capacity which is switched parallel to the circuit load.

BACKGROUND INFORMATION

As in other fields of technology, integrated circuits are being used more widely in automobile technology, for example in the form of microprocessors or microcontrollers. Devices for supplying power are provided to enable their operation. Known devices of this type commonly contain an external blocking capacity which is connected in parallel between a supply input of the integrated circuit and earth, and a voltage source which is connected in parallel to it. The voltage source charges the isolating capacity, and the power which is fed to the integrated circuit is removed from the isolating capacity by means of a discharging current. This is designed to achieve the most realistic simulation possible of an ideal voltage source. The known devices for supply power lead however to an unwanted high level of radiation of electro-magnetic energy, in particular when a clocking frequency of the integrated circuit becomes greater than 10 MHz. Then, the EMC standards set by the automobile industry are also potentially no longer met. cl SUMMARY OF THE INVENTION For this reason, the object of the invention is to provide a device of the type described in the introduction, with the aid of which an integrated circuit can be supplied with power even with a high clocking rate, in particular in the MHz range, whereby at the same time, the EMC standards set by the automobile industry are maintained.

In order to attain this object, the invention provides a device for supplying power to a rapidly clocking, integrated circuit, which comprises a circuit load to be supplied with the power and an internal capacity, which is connected parallel to the circuit load, wherein the device has the following features. The integrated circuit has a high clocking frequency, which is in particular at least in the MHz range. A supply unit, which is in particular designed as a current source, is directly connected to the internal capacity. The supply unit has an internal resistance, the impedance value of which is so high at the clocking frequency and in particular with its harmonics, that a current, which supplies the circuit load, originates to a greater degree from the internal capacity than from the supply unit. This device preferably benefits from the following two advantageous measures. On the one hand, no use is made of the external circuit with the additional isolation or blocking capacity. Instead, an internal bus capacity is used which is already available within the integrated circuit. On the other hand, instead of the low-ohmic voltage source which is used with the known devices, an energy supply is used with the highest possible internal resistance.

The combination of both measures decouples the frequencies when the bus capacity is charged and discharged. While the bus capacity continues to be discharged with the high clocking frequency, the charging is completed with a significantly lower frequency. The latter results from the low pass behavior of the combination of the bus capacity and the high-ohmic internal resistance of the supply unit. Charging frequencies which occur in connection with the charging are smaller by at least one order of magnitude than the discharging frequencies which occur in connection with the discharging, which are essentially determined by the fundamental wave (=clocking frequency) of the clocking rate of the integrated circuit and its harmonic waves. Incidental interferences arise as a result of the internal communication, the fundamental frequency of which is usually operated with half the clocking rate. Signal portions with the high-frequency discharging frequencies are closely restricted in terms of space, and essentially only lie within the integrated circuit. By contrast, signal portions with the low-frequency charging frequencies also run through a circuit board, onto which the integrated circuit is mounted. Neither of the signal portions creates a significant level of radiation of electromagnetic energy—the discharging signal portion due to the close restriction in terms of space within the integrated circuit, and the charging signal portion due to the low frequency.

Overall, an integrated circuit can therefore be supplied with electric power with a high clocking rate by means of the device according to the invention without a notable radiation of electromagnetic energy occurring. The EMC standards set by the automobile industry are also maintained, even with clocking frequencies in the upper MHz range.

A particular preferred embodiment is easy to realize, wherein the supply unit comprises a serial connection, consisting of a voltage source and the internal resistance, which acts as the current source. A current source, which is ideally characterized by an infinitely high internal or inner resistance, is simulated by means of a serial connection of a low-ohmic voltage source with the inner or internal resistance which is dimensioned in relation to the field of application. A voltage source can be constructed in a simple manner. This also applies in particular to a voltage-controlled voltage source.

In another embodiment, the supply unit is part of a regulating unit adapted to regulate the power supplied by the supply unit to the integrated circuit. This ensures that the energy feed corresponds to the current requirements.

In a further embodiment, the regulating unit further comprises a low pass, which is connected to the internal capacity in order to record a voltage that drops across the circuit load. This guarantees that the regulating unit comprises an advantageously low regulating speed. Thanks to the low pass effect, abrupt changes to the drop in voltage on the internal capacity only lead to a slow simulation of charging power.

In a variant, the supply of the power by the supply unit exhibits a low pass behavior with a transition frequency that is lower than the clocking frequency. This prevents high-frequency signal portions from also occurring to a notable degree outside the integrated circuit, i.e. on the in and out or feed and return conductor lines on the circuit board, where they can lead to radiation.

According to another embodiment, the internal resistance comprises a series circuit of at least one low-capacity resistance and a ferrite element. This prevents a too strong inFluence of the parallel capacities of the individual elements used to realize the internal or inner resistance. Parallel capacities are unfavorable because they comprise a low impedance value at high frequencies. The serial connection of a resistance and a ferrite element reduces the unwanted inFluence of the parallel capacity of the ferrite element. Equally, the inFluence of the parasitic parallel capacity of the resistance is reduced when several resistances are connected in series. A good compromise between expense and useful benefit is achieved in particular by the serial connection of four low-capacity resistances. The at least one low-capacity resistance reduces the bridging capacity of the overall arrangement and provides an effective fundamental attenuation, in contrast to which the ferrite element has an unwanted high level of loss, precisely in the high clocking frequency range.

The advantageous further embodiments described below can be realized in any combination required.

BRIEF DESCRIPTION OF THE DRAWINGS

Further features, advantages and details of the invention will now be described below with references to exemplary embodiments and the drawing, in which.

DETAILED DESCRIPTION OF EXAMPLE EMBODIMENTS OF THE INVENTION

Figure 1:
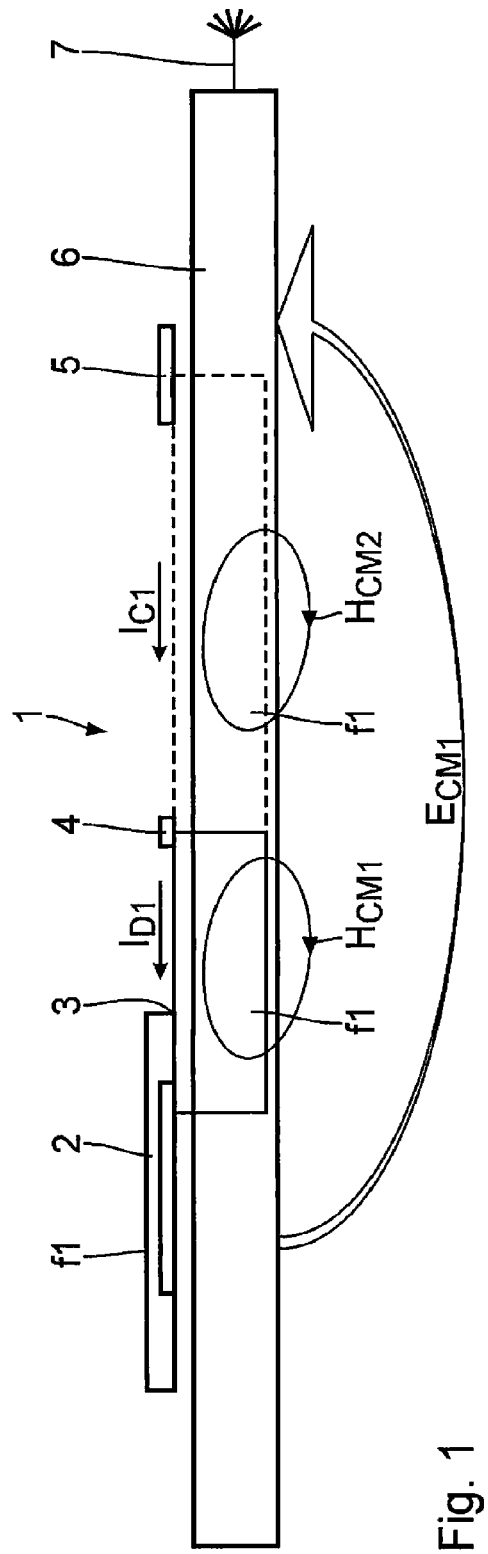
FIGS. 1 and 2 show a device for supplying power to a circuit according to the prior art

Parts which correspond with each other in FIGS. 1 to 7 are assigned the same reference numerals.

Figure 2:
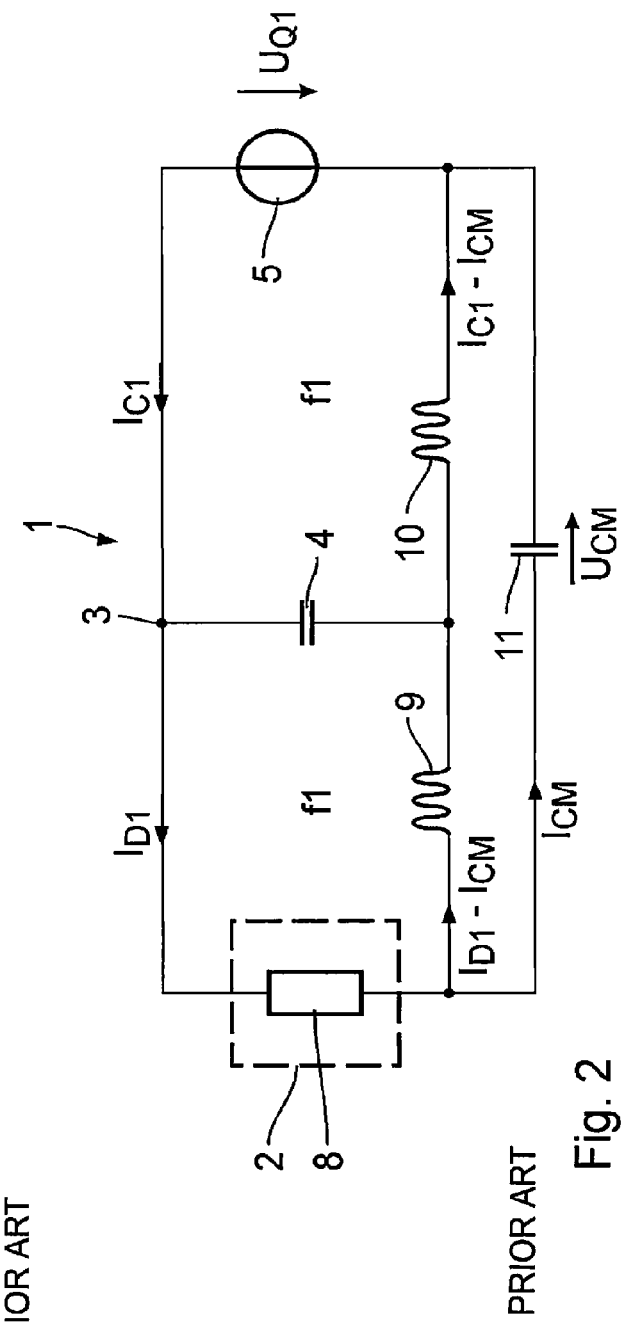

FIGS. 1 and 2 shows a device 1 for supplying power to an integrated circuit 2 according to the prior art. A supply input 3 of the integrated circuit 2 is connected in parallel to an external isolation capacity 4 and a supply unit 5 which is designed as a voltage source. The integrated circuit 2, the isolation capacity 4 and the supply unit 5 are arranged on a dual-layer circuit board 6, to which a cable harness 7 is connected. In the equivalent circuit diagram according to FIG. 2, the integrated circuit 2, which is designed as a rapid cycling microprocessor or microcontroller, or as a rapid cycling memory module, is shown as a complex impedance 8. In addition, two common mode inductive resistors 9 and 10 are arranged in the earth or ground return line, to which an antenna roof capacity 11 is switched in parallel.

The known device 1 for supplying power has the following mode of operation. The supply unit 5 supplies a source voltage $U_{Q1}$. By means of the parallel connected isolation capacity 4, which for example has a capacity value of approximately 100 nF, an ideal voltage source is simulated. The energy supply unit 5 delivers a charging current $I_{C1}$, by means of which the isolation capacity 4 is charged. A discharging current $I_{D1}$ which is removed from the isolation capacity 4 supplies the integrated circuit 2 with power. The charging circuit is shown in FIG. 1 with broken lines and the discharging circuit is shown with unbroken lines. With each switching operating of the integrated circuit 2, part of the charge is therefore removed from the isolation capacity 4. The difference in potential which results is again offset by immediate recharging by means of the power supply unit 5.

The charging current $I_{C1}$ and the discharging current $I_{D1}$ contain the same frequency portions which are essentially determined by the rapidly cycled, integrated circuit 2, in particular, by its cycling frequency f1. As a result, the magnetic fields $H_{CM1}$ and $H_{CM2}$ are created which are symbolised as concentrated elements for the common mode inductive resistors 9 or 10 (FIG. 2) in the feed/return lines of the charging and discharging circuit, and which create drops in voltage with the same clocking frequency f1. Within the feed/return lines of the circuit board 6, a common mode voltage $U_{CM}$ is thus formed which is linked to an electric field $E_{CM1}$ (FIG. 1), and which drives a common mode current $I_{CM}$ as a result of the power storage property of the inductive resistors 9 and 10 (FIG. 2).

Within the scope of the invention, it has been found that the overall arrangement of the circuit board 6 and the cable harness 7 shows a dipole-type antenna behavior. Therefore at least a certain portion of the common mode current $I_{CM}$ is radiated. The degree of radiation here depends strongly on the clocking frequency f1. Due to the dipole-type behavior, the radiation increases by the square of the clocking frequency f1. A high clocking frequency f1, which lies for example within the n×10 MHz range, thus leads to a very high level of radiation. The radiated energy here originates to a large degree from the displacement current of the antenna roof capacity 11 (FIG. 2), i.e. from the common mode current $I_{CM}$.

With the known device 1, as a result of the radiation behavior described, the EMC standards which are specified in particular when the device 1 is used in the field of automobile technology can no longer be met with the increasing clocking frequencies f1.

The exemplary embodiments of the devices for supplying power according to the invention which are shown in FIGS. 3 to 7 avoid the disadvantages described in connection with the known device 1. They show a strongly reduced radiation behavior, so that the EMC standards set by the automobile industry are met even with a high clocking frequency f1.

Figure 3:
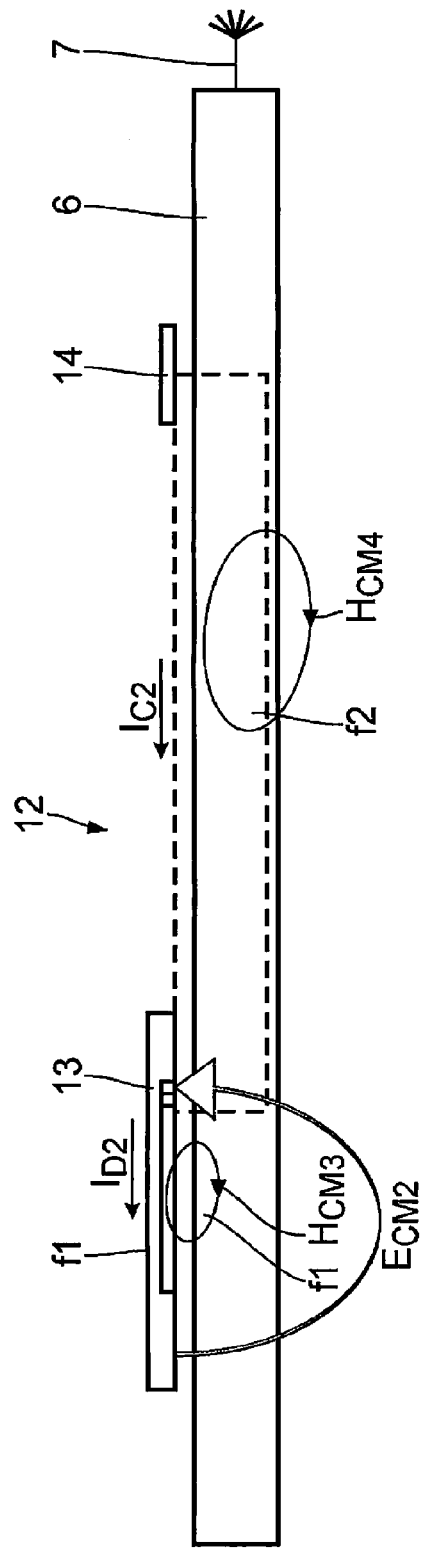
FIGS. 3 and 4 show an exemplary embodiment of a device according to the invention for supplying power to a circuit
Figure 4:
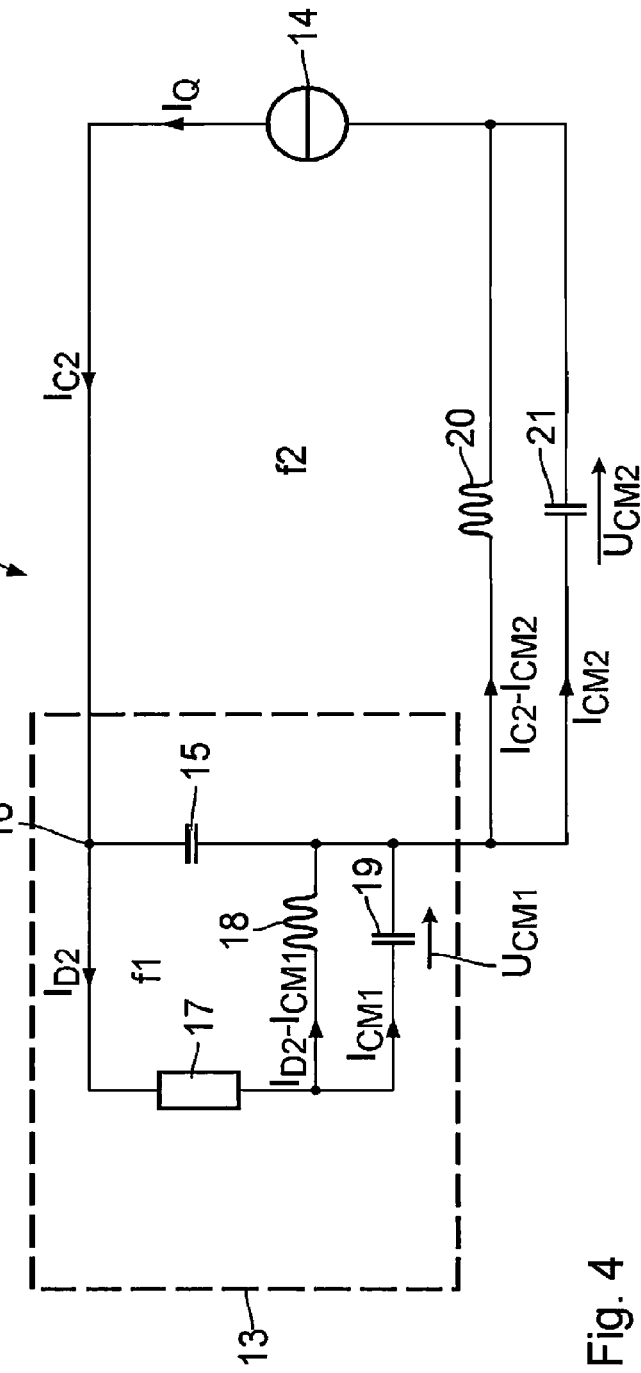

FIGS. 3 and 4 show a first exemplary embodiment of a device 12 according to the invention for supplying power to an integrated circuit 13 by means of a supply unit 14. In contrast to the device 1, the device 12 contains no external isolation capacity 4. Instead, an internal bus capacity 15 is used which is arranged as a component of a supply bus of the integrated circuit 13 in parallel with a supply input 16, and which has a capacity value of approximately 5 nF for example. The cost of realization is reduced due to the use of the bus capacity 15 which is already available. In addition, the supply unit 14 is not designed as a low-ohmic voltage source, as is the device 1, but as a high-ohmic current source.

According to FIG. 4, the integrated circuit 13 contains, alongside the bus capacity 15 and a circuit load 17 which is actually to be supplied and which is symbolised as an impedance, a common mode inductive resistor 18 in its earth return line, and an antenna roof capacity 19 which is arranged in parallel to this. Accordingly, the charging current circuit which essentially runs over the circuit board 6 also comprises in its earth return line a parallel connection consisting of a common mode inductive resistor 20 and an antenna roof capacity 21.

The mode of operation of the device according to the invention 12 will now be described in greater detail below. The charging current circuit and the discharging current circuit are decoupled both in terms of space and in terms of their frequency. The discharging current circuit is restricted to the area of the integrated circuit 13, by contrast to which the charging current circuit essentially runs in the circuit board 6. A discharging current $I_{D2}$, via which power is removed from the bus capacity 15 and fed to the circuit load 17, comprises frequency portions which are essentially determined by the high clocking frequency f1. By contrast, the charging of the bus capacity 15 is achieved by means of a charging current $I_{C2}$, which has a significantly lower charging frequency f2, and which is provided as a source current IQ by the supply unit 14.

The bus capacity 15 and the high-ohmic inner resistance of the supply unit 14 form a low pass which determines the essentially lower frequencies of the charging current $I_{C2}$. In the ideal scenario with an infinitely high inner resistance, the charging current IC2 contains only an equal portion. However, with a practical realization, the charging frequency f2 is lower than the clocking frequency f1 by at least the order of one. Typically, the charging frequency f2 lies within the KHz range and the cycling frequency f1 lies between 50 MHz and 300 MHz. With a charging frequency f2 which is so low, a magnetic field $H_{CM4}$ which is linked to a charging current $I_{C2}$ leads to a common mode voltage $U_{CM2}$ which is lower in proportion to the reduction in frequency. The effectiveness of the dipole-type design of the overall arrangement is decreased by the square of the frequency reduction of f1 in comparison with f2, so that only a very low level of common mode current $I_{CM2}$—if any at all—is formed within the circuit board 6, and no notable radiation occurs. For this reason, the common mode inductive resistors 20 and the antenna roof capacity 21 have not been included in the illustration in FIG. 6 which follows.

Within the integrated circuit 13, a magnetic field $H_{CM3}$ which corresponds to the discharging current $I_{D2}$ leads to the formation of an electric field $E_{CM2}$ and a common mode voltage $U_{CM1}$ as a result of the high frequency portions. Accordingly, a common mode current $I_{CM1}$ is also formed in the earth return line. Since the surface of the integrated circuit 13 which is encompassed by the current $I_{D2}$ is smaller than the surface of the circuit board 6 which is with the device 1 is encompassed by $I_{D1}$, in comparison with the device 1, a significant reduction in radiation results. If an ideal supply unit 14 is present, a comparative assessment of the areas which are in each case contained in the devices 1 and 12, i.e. they are encompassed by the high-frequency currents $I_{C1}$ and $I_{D1}$ or $I_{D2}$, shows a reduction in radiation by a factor of approximately 10,000.

Figure 5:
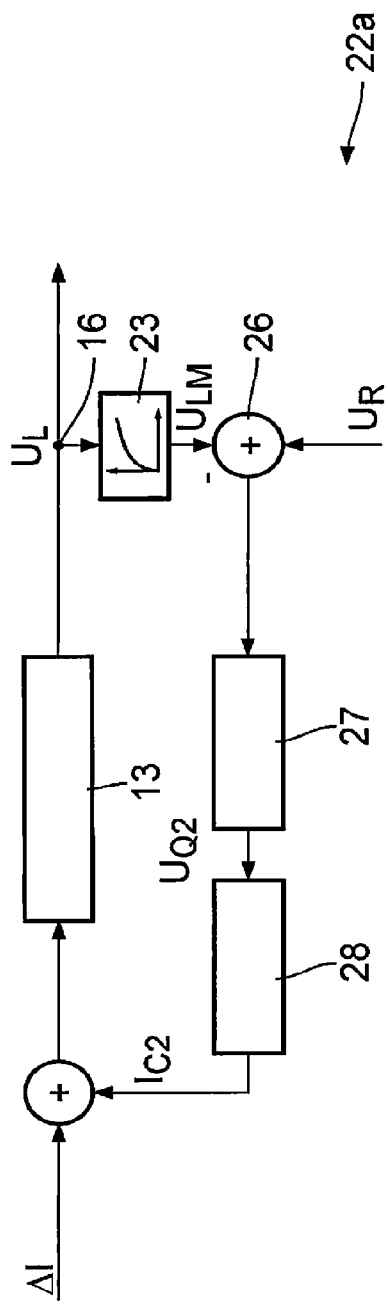
FIG. 5 shows a block diagram for a regulation of the power supply according to FIGS. 3 and 4

FIG. 5 shows a block diagram for a regulation of the power supply to the device 13. A realization of this regulation concept is shown in a further exemplary embodiment of a device 22 for the supply of power to the integrated circuit 13, which is also given in FIG. 6. The regulation ensures that the circuit load 17 is provided with a constant load voltage $U_L$ for the supply of power. Since it is essentially only of relevance that the average value of the voltage which drops on the bus capacity 15 is kept constant, the load voltage $U_L$ can be directly tapped on the supply input 16, whereby both the common mode inductive resistor 18 and also, if appropriate, existing bond inductive resistors can be ignored.

A regulation unit 22a comprises a low pass 23 which is connected to a supply input 16, which is constructed using a low pass resistance 24 and a low pass capacity 25, a reference point 26, a regulator 27 and a U/I converter 28. With the exemplary embodiment according to FIG. 6, the reference point 26 and the regulator 27 are integrated into a voltage-controlled voltage source 29. The U/I converter 28 is realized as internal or inner resistance 30 which is high-ohmic in particular in the range of the clocking frequency f1. The serial connection of the voltage source 29 and the high-ohmic inner resistance 30 forms the supply unit 14 which is a component of the regulating unit 22a. This serial connection represents a simulation of a current source.

Figure 6:
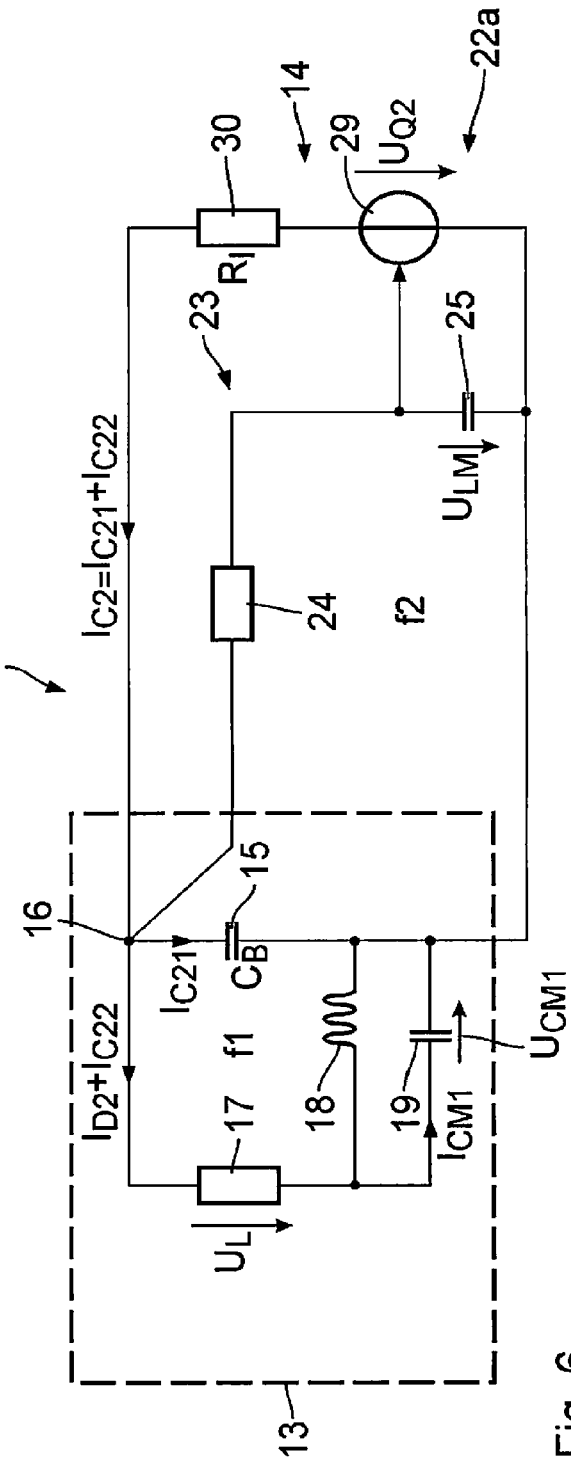
FIG. 6 shows an exemplary embodiment of a device according to the invention for the regulated supply of power to a circuit.

The mode of operation of the regulated power supply which is used with the device 22 will now be described below with reference to FIGS. 5 and 6. The load voltage $U_L$ which as a first approximation is also present on the supply input 16 is recorded on the low pass capacity 25 as a measured load voltage $U_{LM}$, and is fed to the reference point 26 which is integrated into the voltage source 29. Depending on the deviation from a specified reference voltage $U_R$, the regulator 27 is triggered in such a manner that a source voltage $U_{Q2}$ is present on its output, and therefore also on the output of the voltage source 29. The latter is converted by means of the high-ohmic inner resistance 30 into the charging current $I_{C2}$, which is fed to the integrated circuit 13 for the supply of power. Deviations which result from Fluctuations in load or other random events are included in the block diagram according to FIG. 5 by a subjection of the charging current $I_{C2}$ with an interference value $\Delta I$.

Due to the corresponding dimensioning of the low pass 23, the regulation speed is restricted, so that the transit frequency of the regulation is lower than the fundamental wave (=clocking frequency f1) of the clocking of the circuit 13. In particular, this transit frequency lies below the clocking frequency f1 by at least the order of one. With a clocking frequency f1 of 50 MHz for example, the highest frequency which then typically causes the regulation, or allows it to happen, is lower than or equal to 1 MHz. As a result, it is ensured that almost no high-frequency signal portions which are relevant for radiation occur in the circuit board 6.

The last statement applies precisely only with an infinite inner or internal resistance 30. In practice, the inner resistance 30 comprises a finite value, however, so that the charging current $I_{C2}$ is composed of a first low-frequency charging current portion $I_{C21}$ and a second high-frequency charging current portion $I_{C22}$. The first charging current portion $I_{C21}$ is used to charge the bus capacity 15 and the second charging current portion $I_{C22}$ is fed together with the discharging current $I_{D2}$, which is also high frequency, to the circuit load 17 for the supply of power. Here, the charging current $I_{D2}$ which is removed from the internal bus capacity 15 is significantly greater than that of the high-frequency second charging current portion $I_{C22}$ which is removed from the charging current circuit. A corresponding attenuation a(f) results as:

$$a(f) = \left|\frac{I_{C22}}{I_{D2}}\right| = \left|\frac{1}{j2\pi f R_I C_B}\right|,$$

whereby $R_I$ is the value of the inner resistance 30, $C_B$ is the value of the bus capacity 15 and f is the frequency. A requirement here is that the inner resistance 30 can be ideally represented as a purely ohmic resistance. However, on closer inspection, the parasitic parallel capacity should also be taken into account.

The parallel capacity is unwanted because it represents a low-ohmic bridge of the ohmic portion of the inner resistance 30, in particular with high frequencies. In order to minimize this inFluence, the inner resistance 30 is preferably realized by means of a serial connection of several resistances.

Figure 7:
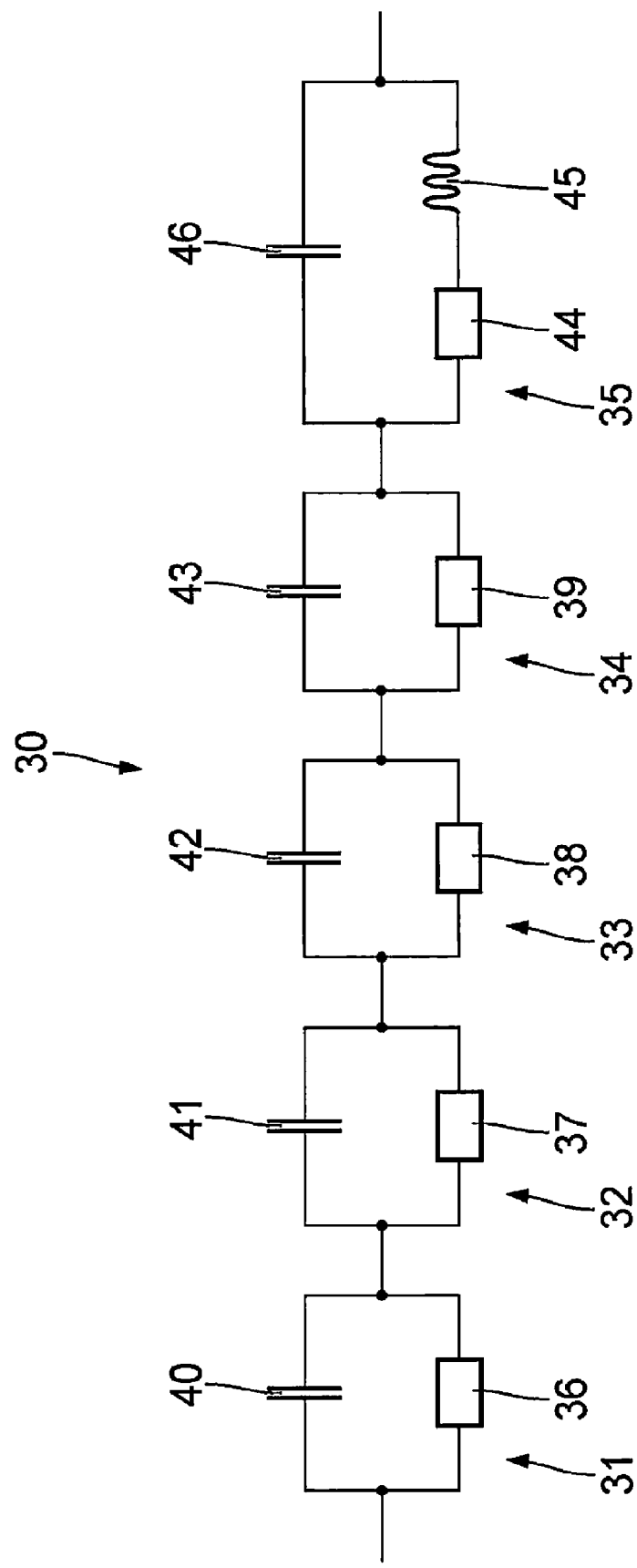
FIG. 7 shows an exemplary embodiment of an inner resistance of the power supply according to FIG. 6

FIG. 7 shows a corresponding exemplary embodiment of the inner resistance 30. It contains a serial connection of a total of four low-capacity partial resistances 31, 32, 33 and 34 and a ferrite element 35. The partial resistances 31 to 34 each have an ohmic resistance 36, 37, 38 or 39 and a parallel capacity 40, 41, 42 or 43. The greater the number of partial resistances 31 to 34 which are connected in series, the lower the unwanted inFluence of the parasitic parallel capacities 40 to 43, which for example have a value of less than 0.5 pF. With a total of four partial resistances 31 to 34 which are connected in series, a good compromise is obtained between cost and useful benefits.

The ferrite element 35 which is also contained in the serial connection of the inner resistance 30 comprises a serial connection of a ferrite resistance 44 and a ferrite inductive resistor 45, and a ferrite capacity 46 which is arranged parallel to these. The partial resistances 31 to 34 which are connected in series to the ferrite element 35 also reduce the inFluence of the parallel ferrite capacity 46.

While the direct current resistance of the ferrite element 35 lies at practically zero ohm, the ohmic portion of the ferrite inductive resistor 45, in particular with high frequencies, i.e. above all with the carrier frequency f1 and its harmonics, causes an unwanted high loss of resistance in the kΩ range, and removes high-frequency power from the electric circuit by converting it into thermal energy. The ohmic resistances 36 to 39 have a total value of approximately 100 Ω. They reduce the bridging capacity of the overall arrangement and provide an effective fundamental attenuation. The inner resistance 30 according to FIG. 7 therefore has a frequency-dependent overall impedance value, which increases in particular with rising frequencies.

The partial resistances 31 to 34 reduce the bridging ferrite capacity 46 to approximately a ¹⁄₂₄th share of its original value. They also increase the resonance frequency of the overall arrangement of the device 22, the circuit board 6 and the cable harness 7 to approximately 5 times the frequency.

When dimensioning the internal or inner resistance 30, a balance is made between the highest possible ohmic resistance value $R_I$ and a value for the source voltage $U_{Q2}$ which can still be realized at a reasonable cost. With the increasing resistance $R_I$, a higher source voltage $U_{Q2}$ is namely required in order to obtain the charging current $I_{C2}$ with the required current level, which can typically lie within the n×100 mA range. The regulator 27 which is for example designed as an upwards/downwards switching regulator is designed for a measured load voltage $U_{LM}$ and for a source voltage $U_{Q2}$, the values of which typically lie within a range of between several volts and several tens of volts. The inner resistance 30 is however continuously dimensioned in such a manner that its impedance value is so high with the clocking frequency f1 that a high-frequency current which supplies the circuit load 17 originates to a greater degree from the bus capacity 15 than the supply unit 14.

The invention claimed is:

1. A device for supplying power to a rapid clocking and/or rapidly clocked integrated circuit, which comprises a circuit load to be supplied with the power and an internal capacity, which is connected parallel to the circuit load, wherein:
    a) the integrated circuit has a high clocking frequency, which is in particular at least in the MHz range,
    b) a supply unit, which is in particular designed as a current source, is directly connected to the internal capacity, and
    c) the supply unit has an internal resistance, the impedance value of which is so high at the clocking frequency and in particular with its harmonics, that a current, which supplies the circuit load, originates to a greater degree from the internal capacity than from the supply unit.

2. The device according to claim 1, characterized in that the supply unit comprises a serial connection, consisting of a voltage source and the internal resistance, which acts as the current source.

3. The device according to claim 1, wherein the supply unit is part of a regulating unit adapted to regulate the power supplied by the supply unit to the integrated circuit.

4. The device according to claim 3, characterized in that the regulating unit further comprises a low pass, which is connected to the internal capacity in order to record a voltage that drops across the circuit load.

5. The device according to claim 1, characterized in that the supply of the power by the supply unit exhibits a low pass behavior with a transition frequency that is lower than the clocking frequency.

6. The device according to claim 1, characterized in that the internal resistance comprises a series circuit of at least one low-capacity resistance and a ferrite element.

\* \* \* \* \*

UNITED STATES PATENT AND TRADEMARK OFFICE
CERTIFICATE OF CORRECTION

PATENT NO. : 8,008,965 B2  
APPLICATION NO. : 11/884648  
DATED : August 30, 2011  
INVENTOR(S) : Goeran Schubert Page 1 of 1

It is certified that error appears in the above-identified patent and that said Letters Patent is hereby corrected as shown below:

Column 1,  
Line 30 (31), after "met.", delete "cl SUMMARY OF THE INVENTION"  
following Line 31, insert a heading --SUMMARY OF THE INVENTION--;

Column 2,  
Line 55, replace "inF1uence" by --influence--;  
Line 59, replace "inF1uence" by --influence--;  
Line 61, replace "inF1uence" by --influence--;

Column 4,  
Line 62, after "current" replace "IQ" by --$I_Q$--;

Column 6,  
Line 4, replace "F1uctuations" by --fluctuations--;  
Line 49, replace "inF1uence" by --influence--;  
Line 58, replace "inF1uence" by --influence--;

Column 7,  
Line 1, replace "inF1uence" by --influence--.

Signed and Sealed this  
Seventh Day of August, 2012

David J. Kappos  
*Director of the United States Patent and Trademark Office*